(12) United States Patent
Van Den Berg

(10) Patent No.: US 10,569,593 B2
(45) Date of Patent: Feb. 25, 2020

(54) METHOD OF PROVIDING AN IMPRINTED SECURITY FEATURE

(71) Applicant: MORPHO B.V., Haarlem (NL)

(72) Inventor: Jan Van Den Berg, Gouda (NL)

(73) Assignee: MORPHO B.V., Haarlem (NL)

( * ) Notice: Subject to any disclaimer, the term of this patent is extended or adjusted under 35 U.S.C. 154(b) by 302 days.

(21) Appl. No.: 15/559,651

(22) PCT Filed: Mar. 22, 2016

(86) PCT No.: PCT/NL2016/050197
§ 371 (c)(1),
(2) Date: Sep. 19, 2017

(87) PCT Pub. No.: WO2016/153345
PCT Pub. Date: Sep. 29, 2016

(65) Prior Publication Data
US 2018/0333977 A1    Nov. 22, 2018

(30) Foreign Application Priority Data
Mar. 25, 2015 (NL) ...................... 2014520

(51) Int. Cl.
*B42D 25/41* (2014.01)
*B42D 25/45* (2014.01)
*B42D 25/324* (2014.01)
*B42D 25/378* (2014.01)
*B42D 25/48* (2014.01)
*G03F 7/00* (2006.01)

(52) U.S. Cl.
CPC ........... *B42D 25/41* (2014.10); *B42D 25/324* (2014.10); *B42D 25/378* (2014.10); *B42D 25/45* (2014.10); *B42D 25/48* (2014.10); *G03F 7/0002* (2013.01)

(58) Field of Classification Search
CPC ...................................................... B42D 25/41
USPC ............................................................ 101/32
See application file for complete search history.

(56) References Cited

U.S. PATENT DOCUMENTS

| 4,765,656 A | 8/1988 | Becker et al. | |
| 5,279,689 A * | 1/1994 | Shvartsman | B29C 35/08 156/220 |
| 8,505,979 B2 * | 8/2013 | Yrjonen | B41M 3/14 283/72 |

(Continued)

FOREIGN PATENT DOCUMENTS

| EP | 0 219 012 A2 | 4/1987 |
| EP | 1 874 557 | 1/2008 |

(Continued)

OTHER PUBLICATIONS

International Search Report, dated Jun. 8, 2016, from corresponding PCT/NL2016/050197 application.

*Primary Examiner* — Anthony H Nguyen
(74) *Attorney, Agent, or Firm* — Young & Thompson

(57) ABSTRACT

Disclosed is a method of forming a security document including the steps of: providing a base layer having a top side; providing a color image onto an image area of the top side by printing colored ink, on the top. A lens structure is applied over the colored ink, the lens structure having a predetermined focal plane situated at a distance from the top side, and laser engraving a black image in through the lens structure and through the colored ink to form blackened image elements substantially at or near the focal plane.

20 Claims, 5 Drawing Sheets

(56) References Cited

U.S. PATENT DOCUMENTS

| | | | |
|---|---|---|---|
| 9,697,456 B2* | 7/2017 | Gregarek | B42D 25/41 |
| 9,873,281 B2* | 1/2018 | Cape | G02B 3/0043 |
| 10,265,995 B2* | 4/2019 | Jung | B41M 3/14 |
| 2006/0261518 A1 | 11/2006 | Willson et al. | |
| 2015/0039564 A1* | 2/2015 | Olson | G06F 11/1458 |
| | | | 707/649 |

FOREIGN PATENT DOCUMENTS

| | | |
|---|---|---|
| EP | 2 553 517 | 2/2013 |
| WO | 2006/110038 A2 | 10/2006 |
| WO | 2009/078881 A1 | 6/2009 |
| WO | 2011/122943 A1 | 10/2011 |
| WO | 2013/028534 A1 | 2/2013 |

* cited by examiner

METHOD OF PROVIDING AN IMPRINTED SECURITY FEATURE

FIELD OF THE INVENTION

The invention relates to a method of forming a security device comprising the steps of:
providing a base layer having a top side,
providing an image having color image elements onto an image area of the top side,
providing a protective layer over the image area and over an image area in a soft or liquid state,
imprinting a pattern into the protective layer in the image area while in its soft or liquid state by contacting the protective layer with an imprint member that is provided with the pattern, and
hardening of the protective layer by irradiating it with optical radiation.

BACKGROUND OF THE INVENTION

It is known to cover a security card having a passport photograph printed onto its surface by a transparent curable resin that forms a protective layer resisting removal of the photograph. The curable resin may be applied by ink jet printing in the shape of security patterns. These patterns may overlie the photograph. After printing, the resin is cured by irradiation with optical radiation, such as UV light. The known method has as a disadvantage that the printed security pattern is relatively coarse and has dimensions in the range of 1 or more mm. Furthermore, the position of a photograph on top of the top side of the security device, forms a stepped surface which may present an access point for tampering or attempted removal of the photograph. Finally, providing a resin curable layer over the photograph as a protective layer, requires application of the protective layer immediately following application of the photograph in order to prevent damaging the photograph or unauthorized alteration.

In EP 0 219 012, in particular in relation to FIG. 7, a data carrier is described in which on a base layer a colored line image is provided by printing. Over the colored line image, a cover layer is applied on top of the base layer, in which cover layer a lenticular array of cylinder lenses is formed. Via a laser, a blackened line image is interlaced in the open space between the printed line images, to form a number of distinct "flip" images that can be observed by tilting the data carrier at different angles to the viewer.

It is an object of the present invention to provide a method of forming a security document having improved security features.

It is a further object of the invention to provide a method of forming a security document having a clearly defined color portrait image.

It is another object of the present invention to provide a method of forming a security device with a portrait image below the protective layer situated below the top surface of the card.

It is a further object of the invention to provide a method of forming a security device having general security features, such as an ID card, bank card, credit card, driver's license or passport, which allows application of an image and personalization of the device at a location and time remote from the site at which general security features have been applied.

SUMMARY OF THE INVENTION

Hereto a method according to the invention is characterized in that the pattern comprises an optical structure having dimensions smaller than 100 µm, wherein the imprint member is transparent and flexible and the protective layer is hardened by the transmission of the optical radiation through the transparent imprint member while it is contacting the protective layer, the imprint member being removed from the protective layer after at least partial hardening of the protective layer, followed by the step of providing a blackened pattern into the base layer by focusing a laser beam via the optical structure and laser engraving image elements into the base layer, in a focal plane that is situated at a vertical distance h of between 50 µm and 150 µm from the color image elements.

By maintaining a flexible and transparent imprint member into contact with the soft or liquid protective layer and curing the protective layer by irradiating optical radiation onto the protective layer through the imprint member, the protective layer can be hardened to a sufficient degree such that removal of the flexible imprint member leaves well-defined small-scale structures. This allows an accurately defined lens pattern to be formed with accurately defined dimensions smaller than 100 µm, in the image area. Through the lens pattern, laser engraved security features can be applied in the image area of the base layer, resulting in enhanced security.

Because the color image elements are situated outside the focal plane of the lenses, there will be no disturbing "flip" effect when observing the color image at different angles. The blackened pattern that is provided through the lenses by laser engraving can provide a security feature in the image area that is independent from the overlying color elements, such as a number or a symbol or any other suitable pattern. It can also form part of a composite image that is composed of the top color image elements and the lower blackened image elements.

The term "blackened" as used herein is intended to describe a darkening of the plastics material under the influence of heat that is generated in the material by the laser beam, and includes different shades of grey on a grey scale ranging from transparent to black.

The flexible imprint member according to the invention can be applied at a site that is remote from the site at which the security device is provided with general security features, so that a personalization step can be carried out including printing an identity photograph of a holder into the security device or the identity device and applying on top of the image, the imprinted lens system and completing the security device or the identity device by laser engraving in the image area through the imprinted lens system.

It is noted that Substrate Conformal Imprint Lithography (SCIL) is a known technology to provide large area patterning on Silicon substrates using a soft composite working stamp carried by a rigid glass carrier. By means of a vacuum between the stamp and the glass carrier, the patterned stamp can be progressively brought into contact with a photo resist layer. After curing of the photo resist layer by impinging light onto it through the transparent stamp, the stamp can be progressively released from the substrate leaving well-defined structures with dimensions of smaller than 100 nm.

In Mingato Li, et al., Fabrication of circular optical structures with a 20 nm minimum size using nano-imprint lithography, Applied physics letters, volume 76, number 6 page 673-675, it is described that a parallel plate imprint machine can be used to manufacture Fresnel Zone plates.

WO 2009/078881 describes an imprint lithography stamp having a regular pattern of sub-features, the stamp being made of silicon or polymeric materials.

However, the use of imprint technology for manufacturing of a lens system overlying color image elements in an image area on a security device, followed by laser engraving in a focal plane that is situated at a vertical distance from the color image elements, is by no means evident from the above disclosures.

In an embodiment of the method according to the invention, the image is provided in the image area via printing of transparent color image elements, such as Yellow, Magenta and Cyan, the optical structure comprising an array of lenticular lenses, wherein the blackened pattern is provided in the base layer by the laser beam through the lenticular lenses and through the transparent color image elements.

Via a printing technology, such as ink jet printing, a color portrait is formed by colored patterns, which may be built up from (partly) overlapping picture elements (for instance droplets) of transparent cyan, yellow and magenta ink. Via the lenticular lenses that are applied over the color portrait, the laser can cause a blackening of the polymer material in the base layer (such as polycarbonate) through the transparent ink, and in that way form blackened picture elements that complete each matching color picture element.

The printed color image elements preferably have an average transmission of at least 50% in the wavelength range between 400 nm and 700 nm. As the ink according to the invention has a transparency of at least 50% for visible light, the underlying blackened picture elements are clearly visible through the ink. The printed picture elements are situated at a distance from the focal point of the lenticular lenses, such that the lens system does not affect the viewing of the colored image.

The blackened picture elements may be formed by the laser being focused by the lenticular lenses to radiate through the color image elements and to cause a blackening in the focal point of the lenses in the underlying layer, which may be formed of for instance laser sensitive polycarbonate. Preferably the color image elements have a transmission of at least 50%, preferably at least 80% at the wavelength of the laser beam, so that the inks are not degraded by energy deposition of the laser beam in the inks.

The method according to the invention allows application of a secure color portrait at a location and time of choice, while the portrait is at least partly applied in the polymer material below the top surface of the security device.

Preferably, a print controller having a memory being is connected to an image applicator, the image being formed by storing image data in the controller memory and providing an ink layer onto the top layer via the image applicator that is connected to the controller, followed by scanning a laser beam that is connected to a laser controller, over the security the area, the laser controller obtaining image data from said memory for burning image elements into the substrate through the array of lenses. In this manner it is possible to apply two or more different images that are rotated with respect to one another though a small angle, as interlaced line images below the cylindrical lenses to provide a three-dimensional impression of the portrait such as described in EP 2 553 517. Alternatively, two or more images that are rotated with respect to one another can be applied as interlaced line images below the lenses to provide a stereoscopic effect when the two images are viewed simultaneously with a respective eye such as described in EP 1 874 557.

Preferably the color elements are contiguous or overlapping, so that the complete image area Ai is covered by color image elements and a high resolution color image is formed.

The invention furthermore relates to a method of forming a security device comprising the steps of:
providing a plastics substrate having an optical pattern,
transporting the substrate to a personalization site,
providing image data of a portrait into a memory of a print controller, the print controller being connected to an image applicator,
forming an image by providing an ink layer of color image elements onto the substrate via the image applicator that is connected to the controller,
applying a protective layer over the substrate in a liquid or softened state,
imprinting a lens pattern into the protective layer in the image area while in its liquid or softened state by contacting the protective layer with a transparent and flexible imprint member that is provided with the pattern,
hardening of the protective layer by the transmission of the optical radiation through the transparent imprint member while it is contacting the layer,
removing the imprint member from the protective layer after hardening of the protective layer,
providing a laser controller and a laser connected to the laser controller,
providing image data of the portrait to the laser controller, and
scanning the laser beam across the lens structure by the laser controller and providing blackened image elements based on the image data into the substrate below the lens elements through the printed color image elements into an underlying layer in a focal plane that is situated at a vertical distance h of between 50 μm and 150 μm from the color image elements.

Although imprinting technology is a preferred manner of providing the lens structure, it is also possible to form the lens structures by other means such as embossing, vacuum forming, milling or 3D printing techniques. The invention is based on the insight that two different image forming techniques can be combined in different planes, and that laser engraving can successfully be carried out through the transparent inks overlying the laser sensitive layer. As the ink layer is outside the focal plane of the lens structure that has been applied on top of it, the colored ink pattern can be properly observed by a viewer, while the underlying blackened image is situated at or near the focal plane of the lens system and is clearly visible through the transparent ink overlying the blackened layer. Hence an embodiment of a method of forming a security document according to the invention comprises the steps of:
providing a base layer having a top side,
providing a color image onto an image area (Ai) of the top side by printing colored image elements of ink having an average transmission of at least 50% in the wavelength range between 400 nm and 700 nm, on the top side,
characterized in that,
a lens structure is applied over the colored ink, the lens structure having a predetermined focal plane situated at a distance from the top side, and
laser engraving a black image in through the lens structure and through the colored ink to form blackened image elements substantially at or near the focal plane.

BRIEF DESCRIPTION OF THE DRAWINGS

Some embodiments of a method according to the invention will by way of non-limiting example be explained in detail with reference to the accompanying drawings. In the drawings.

DETAILED DESCRIPTION OF THE INVENTION

Figure 1A:
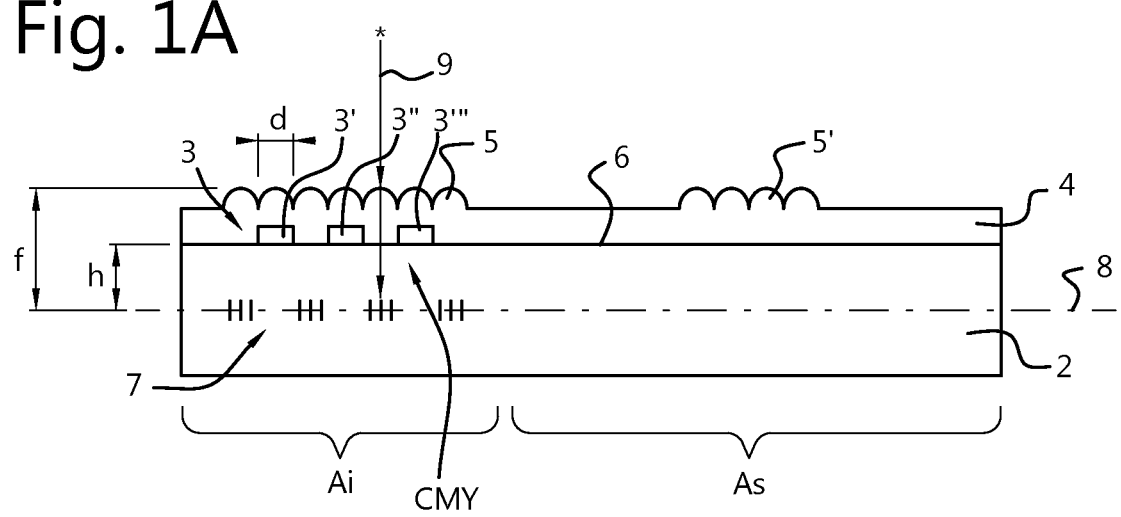
FIGS. 1a-c shows schematic cross-sectional views of a security card according to the invention wherein the color image elements are respectively spaced-apart, contiguous and overlapping.

FIG. 1a shows a security device 1, such as an identity card, a bank or credit card, a driver's license and the like. The device 1 may have a card-like shape or can be in the form of a booklet having a number of pages and including a plastics holder page. The security card 1 comprises a base layer 2 for instance made of PVC, Polycarbonate, PET or combinations thereof, and having on a top side 6 an image area Ai with an image 3, such as a portrait of a holder. The image 3 is formed of color image elements 3', 3", 3"' that may be provided by inkjet printing, photo printing of CMY or via a retransfer process, and is covered by a transparent protective layer 4. The layer 4 may be comprised of a resin such as a urethane acrylate that can be cured by irradiation with UV light. In an image area Ai of the base layer 2, a lens pattern 5 is provided in the protective layer 4. The lenses may have a diameter d of for instance 100 µm and for instance a focal length f of about 200 µm. via a laser, blackened picture elements 7 are provided in the base layer 2 in a focal plane 8.

Figure 1B:
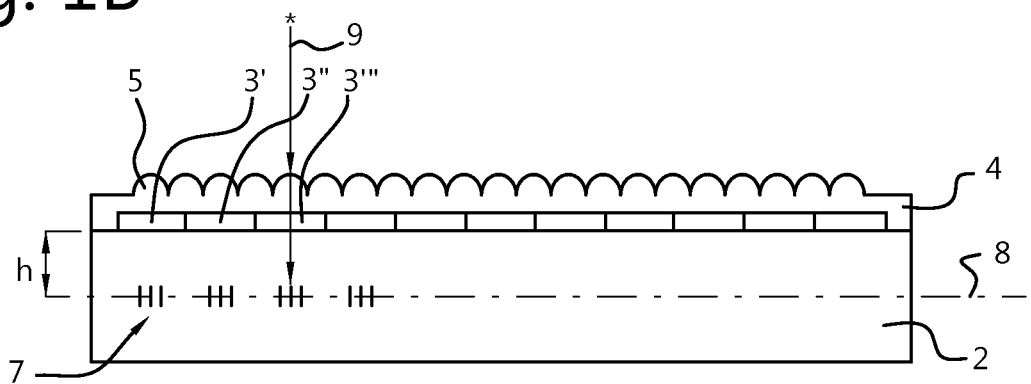
Figure 1C:
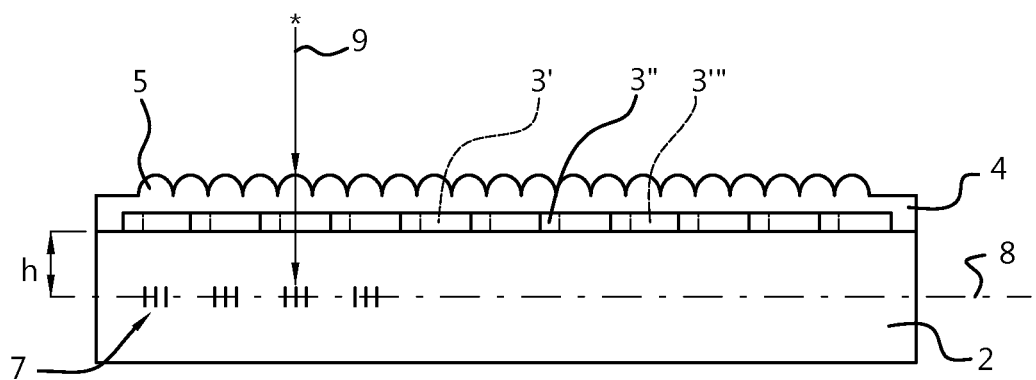

The printed image 3 can be made up of spaced-apart color image elements 3'-3"' such as shown in FIG. 1a, along which the laser beam 9 can pass through the layer 4. Alternatively, the color image 3 can be formed of a contiguous pattern 3'-3"' such as shown in FIG. 1b through which the laser beam 9 passes, or a pattern of overlapping color image elements 3'-3"' as shown in FIG. 1c of transparent C, M, and Y elements such as color drops, situated at a distance h from the focal plane 8 of for instance 50 µm-150 µm.

The blackened picture elements 7 are formed by the laser beam 9 penetrating the ink of the image layer 3, and is visible through the transparent image layer 3. Surprisingly, a sharply defined composite color image can be obtained in which the blackened picture elements 7 are visible through the color image 3 with a well-defined grayscale.

In a security area As of the base layer 2, a pattern 5' may be provided in the protective layer 4. The pattern 5' may be formed of a security structure such as a reflective pattern, a guilloche or the like, but may also be formed by a lens structure. The pattern 5' may be positive or negative (i.e. above or below the surface of the protective layer 4), a gloss or a matte pattern, corner cubes and the like. The patterns 5, 5' are small-scale patterns having dimensions d of less than 100 µm, for instance 80 µm. The patterns 5, 5' are formed by contacting the protective layer 4 when in its softened state with an imprint member that is flexible and transparent, such as for instance made of silicone rubber such as available from Dow Corning under the trade name Sylgard 184. The imprint member is contacted with the protective layer 4 while it is in its liquid or softened state, and is allowed to remain in contact therewith while UV light is irradiated through the imprint member into the protective layer 4 until this layer has (at least partially) hardened. After hardening of the protective layer 4, the imprint member is removed.

The pattern 5 overlying the image area Ai is formed by an array of cylindrical lenses such as described in detail in U.S. patent application no 2011/0149405 in the name of the applicant or in U.S. Pat. No. 4,765,656.

Figure 2:
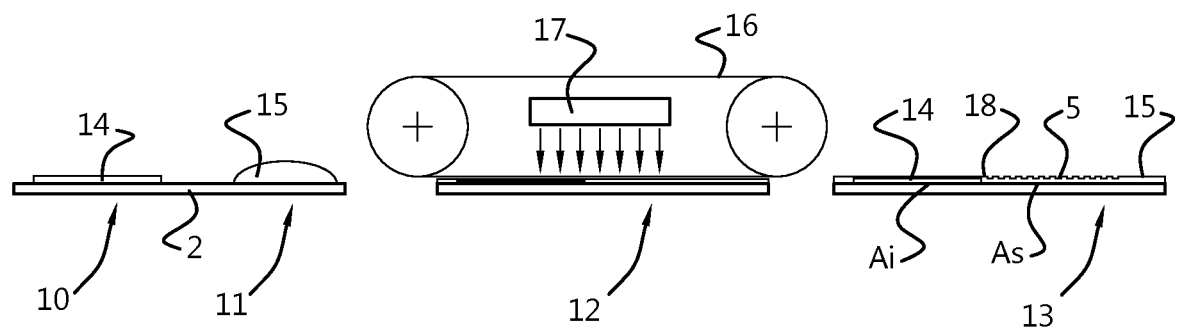
FIG. 2 shows a schematic process of providing an optical pattern onto a security document using an imprint belt, FIGS. 3a and 3b, 3c respectively show a rigid and a hinging stamp imprint member.

In FIG. 2 a number of processing stations is shown, including a printing station 10, a resin application station 11, an imprinting station 12, and a processing station 13, which may comprise a laser engraving station. In the printing station 10 a photograph 14 is applied to the base layer by ink jet printing. Next, in the application station 11, a layer of curable resin 15 is applied that is spread out at least across the image area Ai in the imprinting station 12. The imprinting station 12 comprises an at least partly UV transparent belt 16 having an imprinting surface which contacts the soft or liquid resin 15. A light source 17 emits UV light through the belt 16 into the resin layer 15, which hardens as a consequence of the irradiation. After curing, the belt 16 is removed and the base layer 2 with on it the printed photograph 14 and the overlying cured resin layer 15 which in the image area Ai and/or in the security area as is provided with an optical lens pattern.

Figure 3A:
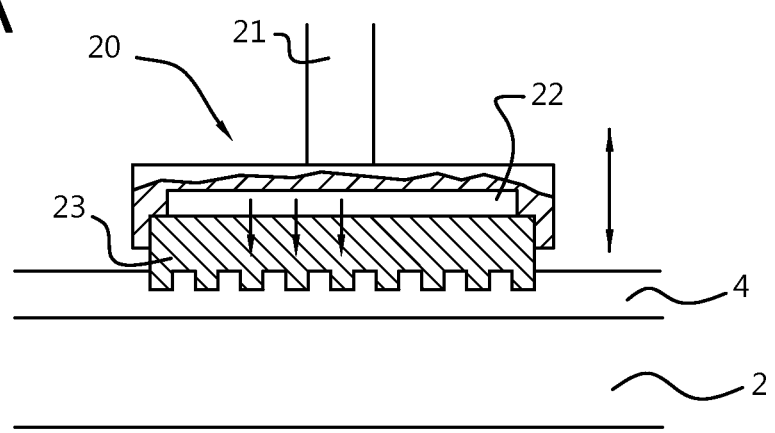

In FIG. 3a a vertically movable stamp imprinting member 20 is shown, as an alternative for the rotating belt 16 shown in FIG. 2. The imprinting member 20 comprises a holder 21, for instance made of metal, in which a light source 22 is mounted. A transparent flexible imprint surface 23, for instance made of silicone rubber is connected to the holder 21 in an easily exchangeable manner, such that it can be replaced when subject to wear or when a different imprint pattern is desired.

Figure 3B:
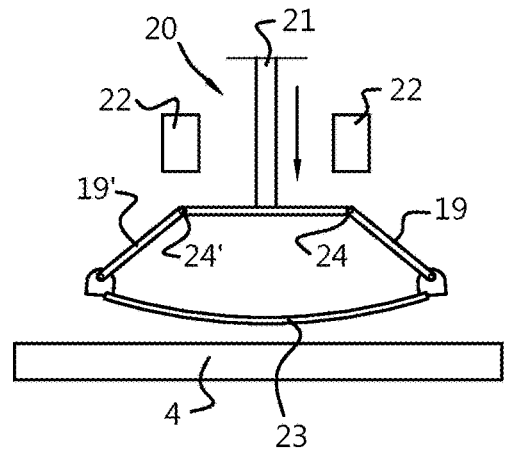
Figure 3C:
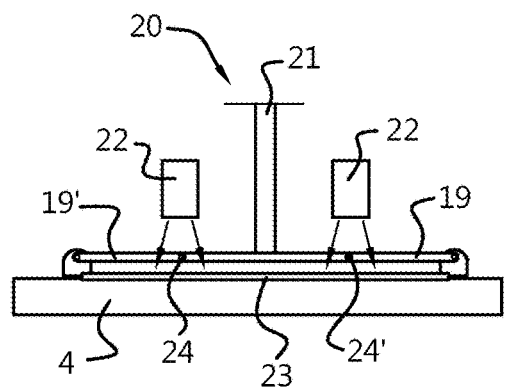

In FIG. 3b a hinging imprinting member 20 is shown prior to and during contact with the liquid protective layer 4. In this embodiment, the flexible imprint surface 23 is mounted between the ends of hinging arms 19, 19' that are connected in hinge points 24, 24' to a central member 21. Upon pressing downward onto the liquid protective layer 4, the imprint surface 23 is rolled onto the layer 4, so that an accurately defined lens pattern can be formed. The arms 19, 19' should be mounted such as not to cover the layer 4 from the UV light source 22 or should be constructed of UV transparent material.

Figure 4:
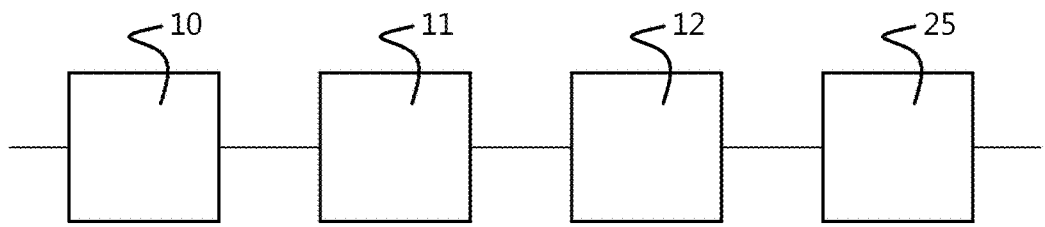
FIG. 4 shows the process steps of a process for forming a security device.

FIG. 4 schematically shows the stations 10-12 of FIG. 2 in combination with a laser engraving station 25. This allows production of a security card or document comprising a number of general security features such as images or patterns, numbers and the like, on one site, and to apply personalization features at another location, such as an image in photo printing station 10. After covering the image area and the security area with resin in application station 11 and imprinting a lens structure in the security area in station 12, a laser engraving station 13 can utilize the image data to provide a laser engraved image through the lens structure provided in station 12 into the base layer of the security device at the position of the image area Ai. In this manner, the color image can be completed by the black laser engraved image and is in combination visible for an inspection person through the lens structure.

Figure 5:
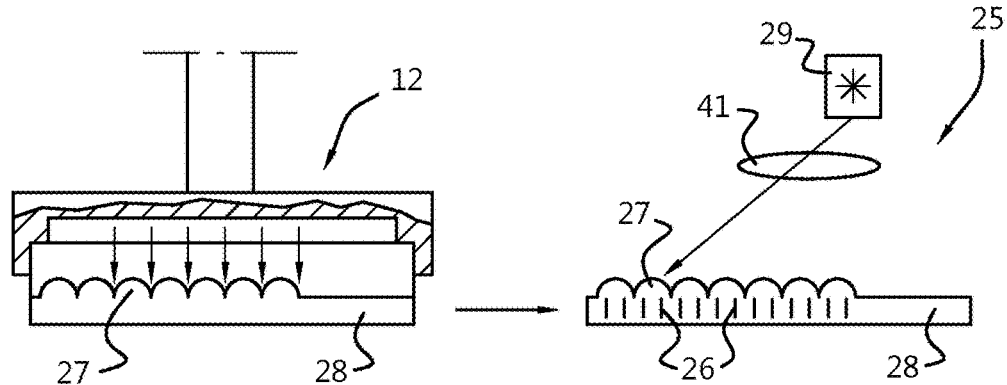
FIG. 5 shows the process of forming an array of lens elements by means of imprinting followed by laser engraving through the lens elements.

FIG. 5 shows the imprinting station 12 and the laser engraving station 25 in which in the imprinting station 12 a lenticular array of cylindrical lenses 27 is applied in a top layer overlying base layer (made for instance resin overlying a layer of Polycarbonate) 28. In the laser engraving station 25, a laser 29 focuses a laser beam via a lens member 41 and the cylindrical lenses 27, into the polycarbonate layer 28, to form blackened image areas 26.

Figure 6:
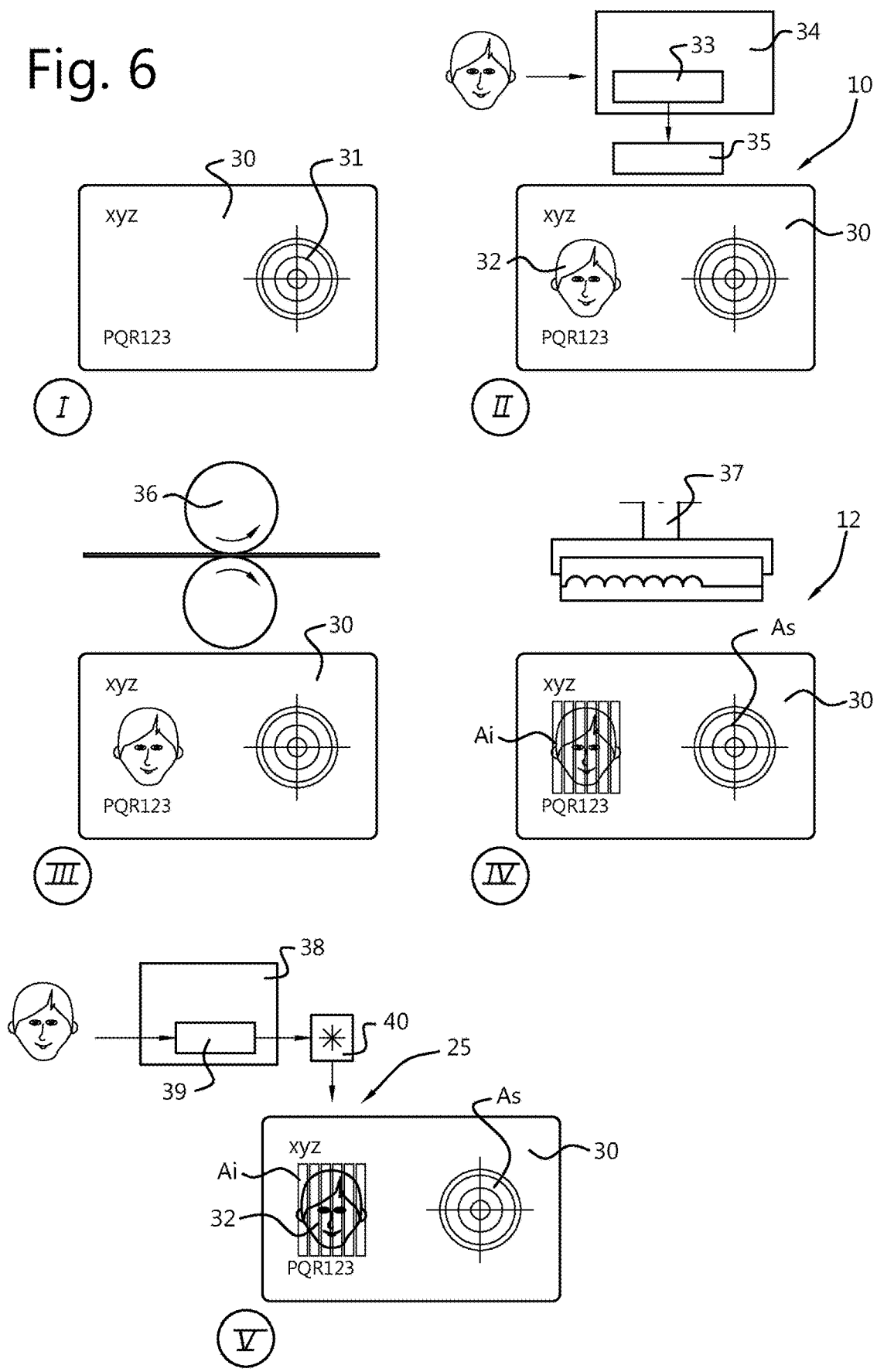
FIG. 6 shows the steps of production and personalization of a security device at different locations, and FIG. 7 show the absorption spectra of six different inks for use in the present invention.

In FIG. 6 at I a security card 30 is shown, having general security information 31. The security card 30 at II is placed in the photo printing station 10. In the photo printing station 10, image data is read into a memory 33 of a print controller 34, driving the printer head 35 such that an image 32 of a portrait is printed onto the card 30. At III, the applicator 36 applies resin across the image area, covering the image 32, and optionally across the security area of the card 30. In imprinting station 12, the imprinting member 37 contacts the image area Ai to form an array of lens elements in the image area. Finally at V, the card 30 is placed in the laser engraving station 25, wherein image data is provided into the memory 39 of laser controller 38, and the laser 40 is scanned across the card 30 to form blackened image elements into the card material below the lenses in the image area As, for instance to form a full color portrait, preferably a three dimensional image such as described in EP 1 874 557.

Figure 7:
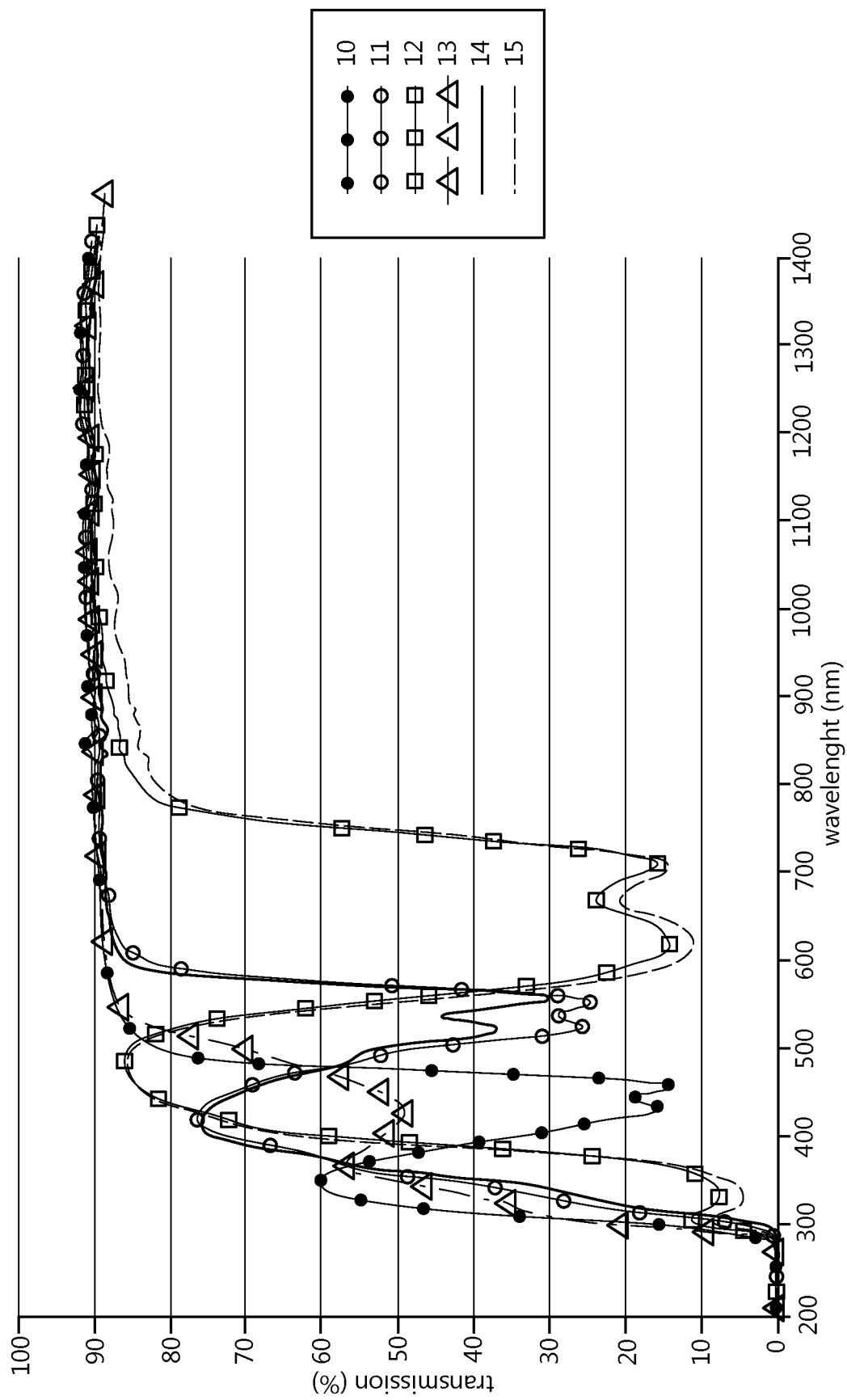

FIG. 7 shows the transmission for 6 types of inks that are suitable for forming color image elements 3',3",3''' according to the invention. The inks 10, 11, 12 were yellow, magenta and cyan of UV-curable inkjet inks available from Agfa and inks 13, 14, 15 were yellow, magenta and cyan respectively of a UV-curable Ink Y61, Ink M44 and Ink C45 provided by the applicant. The inks were uniformly applied in a 4 µm layer on a 215 µm transparent polycarbonate carrier foil. For inks 10, 11, 12 the average transmission in the wavelength range of visible light of 400 nm-700 nm is 69%, 66% and 51% respectively. At the wavelength of the laser 9, which in this example was 1064 nm, the transmission of all inks 10-15 is between 88% and 91%.

The invention claimed is:

1. Method of forming a security document (1) comprising the steps of:
    providing a base layer (2) having a top side (6),
    providing an image (3) having color image elements (3',3",3''') onto an image area (Ai) of the top side (6)
    providing a protective layer (4) over the image area (Ai) in a soft or liquid state,
    imprinting a pattern (5,27) into the protective layer (4) in the image area (Ai) while in its soft or liquid state by contacting the protective layer (4) with an imprint member (16,20) that is provided with the pattern, and
    hardening of the protective layer by irradiating it with optical radiation,
    wherein,
    the pattern (5) comprises an optical structure having dimensions smaller than 100 µm, wherein the imprint member (16,20) is transparent and flexible and the protective layer (4) is hardened by the transmission of the optical radiation through the transparent imprint member while it is contacting the protective layer, the imprint member (16,20) being removed from the protective layer (4) after at least partial hardening of the protective layer, followed by the step of providing a blackened pattern (7) into the base layer (2) by focusing a laser beam via the optical structure and laser engraving image elements into the base layer in a focal plane (8) that is situated at a vertical distance h of between 50 µm and 150 µm from the color image elements.

2. Method according to claim 1, wherein the image (3) is provided in the image area (Ai) via printing of transparent color image elements (3',3",3'''), the optical structure comprising an array (27) of lenticular lenses, wherein the blackened pattern (7) is provided in the base layer by the laser beam through the lenticular lenses and through the transparent color image elements (3',3",3''').

3. Method according to claim 2, wherein the color image elements (3'-3''') have an average transmission of at least 50% in the wavelength range between 400 nm and 700 nm.

4. Method according to claim 3, wherein the color image elements (3'-3''') have a transmission of at least 50% at the wavelength of the laser beam.

5. Method according to claim 1, wherein the color elements (3'-3''') are contiguous or overlapping.

6. Method according to claim 1, wherein after removal of the imprint member (16, 20), the base layer (2) is transported to a personalization station (25) comprising the laser (29, 40), where after personalization data is provided into the base layer via the optical structure.

7. Method according to claim 1, a print controller (34) having a memory (33) being connected to an image applicator (35), the image being formed by storing image data in the controller memory (33) and providing an ink layer onto the base layer (2) via the image applicator that is connected to the controller, followed by scanning the laser beam (29,40) that is connected to a laser controller (38), over the image area (Ai), the laser controller (38) obtaining image data from the controller memory (33) for burning image elements into the base layer (2) through the array of lenses.

8. Method according to claim 1, wherein the protective layer is of larger dimensions than the image area.

9. Method of forming a security document (1) comprising the steps of:
    providing a plastics substrate (30) having an optical pattern (31), transporting the substrate (30) to a personalization site,
    providing image data of a portrait (32) into a memory (33) of a print controller (34), the print controller being connected to an image applicator (35),
    forming an image by providing an ink layer of color image elements onto the substrate (30) in an image area (Ai) via the image applicator that is connected to the print controller,
    applying a protective layer (4) over the substrate (30) in a liquid or softened state,
    imprinting a lens pattern (5,27) into the protective layer (4) overlying the image in the image area (Ai) while in its liquid or softened state by contacting the protective layer with a transparent and flexible imprint member (16,20) that is provided with the pattern,
    hardening of the protective layer by the transmission of the optical radiation through the transparent imprint member (16,20) while it is contacting the protective layer(4),
    removing the imprint member (16,20) from the protective layer after hardening of the protective layer,
    providing a laser controller (38) and a laser (40) connected to the laser controller,
    providing image data of the portrait to the laser controller (40), and
    scanning the laser beam across the lens structure by the laser controller and providing blackened image elements (26) based on the image data into the substrate (30) below the lens elements through the printed color image elements (3'-3''') into an underlying layer in a focal plane (8) that is situated at a vertical distance h of between 50 µm and 150 µm from the color image elements.

10. Method according to claim 9 wherein the color image elements of ink have an average transmission of at least 50% in the wavelength range between 400 nm and 700 nm.

11. Method according to claim 10, wherein the color image elements (3'-3''') of ink have a transmission of at least 50% at the wavelength of the laser beam.

12. Method of forming a security document (1) comprising the steps of:
providing a base layer (2) having a top side (6),
providing a color image (3) onto an image area (Ai) of the top side (6) by printing color image elements (3'-3''') of ink having an average transmission of at least 50% in the wavelength range between 400 nm and 700 nm, on the top side (6),
wherein,
a lens structure is applied over the colored ink, the lens structure having a predetermined focal plane (8) situated at a distance from the top side (6), and
laser engraving blackened image elements (7) through the lens structure and through the color image elements (3'-3''') to form the blackened image elements substantially at or near the focal plane.

13. Method according to claim 12, wherein the focal plane (8) that is situated at a vertical distance h of between 50 μm and 150 μm from the color image elements.

14. Method according to claim 12, wherein the color image elements have a transmission of at least 50% at the wavelength of the laser beam.

15. The method of claim 2, wherein the transparent color image elements (3',3'',3'''), are Yellow, Magenta and Cyan.

16. The method of claim 4, wherein the color image elements (3'-3''') have a transmission of at least 80% at the wavelength of the laser beam.

17. The method of claim 8, wherein the protective layer covers substantially the entire base layer (2).

18. The method of claim 11, wherein the color image elements (3'-3''') of ink have a transmission of at least 80% at the wavelength of the laser beam.

19. The method of claim 14, wherein the color image elements have a transmission of at least 80% at the wavelength of the laser beam.

20. Method according to claim 2, wherein the color elements (3'-3''') are contiguous or overlapping.

* * * * *